United States Patent
Kim et al.

(10) Patent No.: US 8,924,826 B2
(45) Date of Patent: Dec. 30, 2014

(54) FORWARD ERROR CORRECTION ENCODER

(75) Inventors: Seuk B. Kim, Plano, TX (US); Douglas E. Wente, Murphy, TX (US)

(73) Assignee: Texas Instruments Incorporated, Dallas, TX (US)

(*) Notice: Subject to any disclaimer, the term of this patent is extended or adjusted under 35 U.S.C. 154(b) by 209 days.

(21) Appl. No.: 13/468,897

(22) Filed: May 10, 2012

(65) Prior Publication Data

US 2013/0305127 A1 Nov. 14, 2013

(51) Int. Cl.
*H03M 13/00* (2006.01)
*H03M 13/15* (2006.01)
*H04L 25/03* (2006.01)

(52) U.S. Cl.
CPC ....... *H03M 13/151* (2013.01); *H04L 25/03866* (2013.01)
USPC ............................. 714/785; 714/752; 714/751

(58) Field of Classification Search
CPC ... H03M 13/07; H03M 13/15; H03M 13/151; H04L 25/03866; H04L 1/0057
USPC .......................................... 714/785, 752, 751
See application file for complete search history.

(56) References Cited

U.S. PATENT DOCUMENTS

| | | | |
|---|---|---|---|
| 7,499,500 B2 | 3/2009 | Page | |
| 7,873,892 B2 | 1/2011 | Ganga et al. | |
| 8,108,756 B2 | 1/2012 | Ganga et al. | |
| 8,245,095 B2* | 8/2012 | Ou et al. | 714/752 |
| 2009/0276681 A1 | 11/2009 | Ou et al. | |
| 2010/0095185 A1* | 4/2010 | Ganga et al. | 714/758 |
| 2010/0229067 A1* | 9/2010 | Ganga et al. | 714/752 |
| 2011/0126074 A1* | 5/2011 | Calderon et al. | 714/752 |
| 2012/0110421 A1* | 5/2012 | Ganga et al. | 714/776 |
| 2012/0127900 A1* | 5/2012 | Song et al. | 370/310 |

OTHER PUBLICATIONS

"Carrier Sense Multiple Access withCoiiision Detection (CSMA/CD) Access Method and Physicai Layer Specifications Amendment 4: Ethernet Operation over Electricai Backplanes," IEEE-SA Standards Board, Mar. 22, 2007.*
"Carrier Sense Multiple Access withCollision Detection (CSMA/CD) Access Method and Physicai Layer Specifications Amendment 4: Ethernet Operation over Electrical Backplanes," IEEE-SA Standards Board, Mar. 22, 2007.
IEEE Standard 802.3-2008 section 1, Dec. 26, 2008.
IEEE Standard 802.3-2008 section 2, Dec. 26, 2008.
IEEE Standard 802.3-2008 section 3, Dec. 26, 2008.
IEEE Standard 802.3-2008 section 4, Dec. 26, 2008.
IEEE Standard 802.3-2008 section 5, Dec. 26, 2008.

* cited by examiner

*Primary Examiner* — John Trimmings
(74) *Attorney, Agent, or Firm* — Alan A. R. Cooper; Frederick J. Telecky, Jr.

(57) ABSTRACT

A method for encoding data words into a frame is provided. Input data words are received on a first bus having a first width. The input data words are buffered so as to output intermediate data words onto a second bus having a second width. A transcode bit is generated from the intermediate data words, and a set of parity bits is generated from the intermediate words using a syndrome generator, where the syndrome generator uses a number of bits that are equal to the second width. A frame is then generated from the intermediate data words and the set of parity bits and is output to a third bus having the first width.

5 Claims, 2 Drawing Sheets

FORWARD ERROR CORRECTION ENCODER

TECHNICAL FIELD

The invention relates generally to an encoder and, more particularly, to a forward error correction (FEC) encoder.

BACKGROUND

Turning to FIG. 1, an example of a conventional system 100 can be seen. In this system 100, hosts 102-1 to 102-N (which can, for example, be a computer, router, or switch) are able to communicate with one another over communications medium 112 (which can, for example, be an optical fiber, backplane, or twisted pair) through network interfaces 104-1 to 104-N. In this example, the network interfaces 104-1 to 104-N employ Ethernet over Electrical Backplanes and, more specifically, 10 GBase-KR. A description of 10 GBase-KR can be found in the Institute of Electrical and Electronics Engineers (IEEE) standard 802.3-2008 (which is dated Dec. 26, 2008 and which is incorporated by reference herein for all purposes). These network interfaces 104-1 to 104-N employ media access control (MAC) circuits 106-1 to 106-N that communicate with physical transceivers (PHYs) 110-1 to 110-N via media independent interfaces (MIIs) 108-1 to 108-N (which can typically have half-duplex or full-duplex operation). Each of which is described in IEEE standard 802.3-2008.

Of interest here, however, are PHYs 110-1 to 110-N, and, as can be seen in greater detail in FIG. 2, PHYs 110-1 to 110-N (hereinafter PHY 110), PHY 110 employs several sublayers. This PHY 110 can be an independent integrated circuit (IC) or can be integrated with a MAC circuit (i.e., MAC circuit 106-1) and an MII 108. As shown, the PHY 110 is generally comprised of physical medium dependant (PMD) sublayer logic 212, physical medium attachment (PMA) sublayer logic 210, forward error correction (FEC) sublayer logic 204, and physical coding (PCS) sublayer logic 202. These sublayer logic circuits 202, 204, 210, and 212 interact with one another to provide communications between MII 108 and communications medium 112. For transmission, the FEC sublayer logic 204 employs an encoder 206 as described in IEEE standard 802.3-2008, clause 74, and, for reception, the FEC sublayer logic 204 employs a decoder 308 as described in IEEE standard 802.3-2008, clause 74.

Looking specifically to encoder 206 (which can be seen in greater detail in FIG. 3), it is able to encode multiple words from the PCS sublayer logic 202 into a frame. For example, the encoder 206 can encode 32 words, having 64 bits each (i.e., two header bits and 64 payload bits), into a frame having 2112 bits. As shown, the formatter 302 (which is generally comprised of input registers 312 and 314) receives the input data IN and aligns data format and transcode data. The converter 304 (which generally includes a transcoder and a 64b/66b converter) is able to generate a data word (i.e., 65-bit data word) from each input data word (i.e., 66 bits) by XORing one of the transcode bits with data bits (i.e., 8 data bits). These data words can then be provided to the reformatter 308 and the syndrome generator 306 and can have a polynomial representation m(x). The syndrome generator 306 (which generally includes 64-bit and 34-bit syndrome generators) can then generate parity bits (i.e., 32 parity bits) for each frame. Typically, the polynomial representation for these parity bits is:

$$c(x)=p(x)+x^{32}m(x) \quad (1)$$

where $$p(x)=x^{32}m(x) \bmod g(x) \quad (2)$$

and $$g(x)=x^{32}+x^{23}+x^{21}+x^{11}+x^2+1 \quad (3)$$

The resulting frame would then include a payload having output data words followed by parity bits. For example, there can be 32 output data words (which each have one header bit and 64 data payload bits) concatenated with 32 parity bits, resulting in a frame size of about 2112 bits. The pseudorandom number generator 310 and combiner (which can generally function as a scrambler) can then scramble the frame using a (for example) 2112-bit pseudonoise sequence.

Some problems with this arrangement, however, are latency and bulkiness. Because formatter 302 employs input registers 312 and 314 there is a delay from the alignment, and, because conversion is split between the converter 304 and reformatter 308, a multi-cycle (typically two cycle) delay is introduced. Additionally, because of the bit lengths employed (i.e., 66 and 65 bits), 34-bit and 66-bit syndrome generators are employed. Therefore, there is a need for an improved encoder.

Some examples of conventional systems are: U.S. Pat. No. 7,499,500; U.S. Pat. No. 7,873,892; U.S. Pat. No. 8,108,756; U.S. Patent Pre-Grant Publ. No. 2009/0276681; U.S. Patent Pre-Grant Publ. No. 2010/0095185; U.S. Patent Pre-Grant Publ. No. 2010/0229067; and "IEEE Standard 802.3ap-2007: Carrier Sense Multiple Access with Collision Detection (CSMA/CD) Access Method and Physical Layer Specifications, Amendment 4: Ethernet Operation over Electrical Backplanes," *IEEE-SA Standards Board*, Mar. 22, 2007; and IEEE Standard 802.3-2008 sections 1-5, Dec. 26, 2008 (which has been incorporated by reference above).

SUMMARY

In accordance with the present invention, a method is provided. The method comprises receiving a plurality of input data words using a first bus having a first width; buffering each of the plurality of input data words so as to output each of a plurality of intermediate data words onto a second bus having a second width; generating a transcode bit from the plurality of intermediate data words; generating a set of parity bits from the plurality of intermediate words using a syndrome generator, wherein the syndrome generator uses a number of bits that are equal to the second width; generating a frame from the plurality of intermediate data words and the set of parity bits; and outputting the frame to a third bus having the first width.

In accordance with the present invention, the method further comprises scrambling the frame following the step of generating the frame.

In accordance with the present invention, generating the frame further comprises: generating a data payload for the frame from the intermediate data words; and concatenating the data payload with the set of parity bits.

In accordance with the present invention, the step of scrambling further comprises scrambling the frame with a pseudonoise sequence.

In accordance with the present invention, the step of receiving further comprises receiving the input data from a physical coding (PCS) sublayer, and wherein the method further comprises outputting the output data and header to a physical medium attachment (PMA) sublayer.

In accordance with the present invention, the first width is 66 bits, and wherein the second width is 65 bits, and wherein the frame is 2112 bits in length, and wherein the set of parity bits has 32 bits.

In accordance with the present invention, an apparatus is provided. The apparatus comprises physical medium dependant (PMD) sublayer logic that is configured to communicate with a communications medium; PMA sublayer logic that is coupled to the PMD logic; PCS sublayer logic that is configured to communicate with an interface; and forward error correction (FEC) sublayer logic having: a decoder that is coupled to the PMA sublayer logic and the PCS sublayer logic; and an encoder having: a formatter that is coupled to the PCS sublayer logic by way of a first bus having a first width; a second bus having a second width that is coupled to the formatter; a transcoder that is coupled to the second bus, wherein the transcoder is configured to generate a transcode bit for each frame; a syndrome generator that is coupled to the second bus, wherein the syndrome generator uses a number of bits that are equal to the second width, and wherein the syndrome generator is configured to generate a set of parity bits for each frame; and a converter that is coupled to the second bus and that is coupled to the PMA sublayer logic by way of a third bus having the first width, wherein the converter is configured to generate a frame having a data payload concatenated with the set of parity bits.

In accordance with the present invention, the encoder further comprises a scrambling circuit that is coupled to the third bus.

In accordance with the present invention, the scrambling circuit further comprises: a pseudorandom number generator; and a combiner that is coupled to the pseudorandom number generator and the third bus.

In accordance with the present invention, the formatter further comprises an input register.

In accordance with the present invention, the first width is 66 bits, and the second width is 65 bits.

In accordance with the present invention, the set of parity bits has 32 bits, and the frame is 2112 bits.

In accordance with the present invention, the pseudorandom number generator is configured to generate a pseudonoise sequence that is 2112 bits in length.

In accordance with the present invention, an apparatus is provided. The apparatus comprises a communications medium; a plurality of network interfaces, wherein each network interface includes: a media access control (MAC) circuit; a media independent interface (MII) that is coupled to the MAC circuit; and a physical transceiver (PHY) having: PMD sublayer logic that is configured to communicate with a communications medium; PMA sublayer logic that is coupled to the PMD logic; PCS sublayer logic that is coupled to the MII; and FEC sublayer logic having: a decoder that is coupled to the PMA sublayer logic and the PCS sublayer logic; and an encoder having: a formatter that is coupled to the PCS sublayer logic by way of a first bus having a first width; a second bus having a second width that is coupled to the formatter; a transcoder that is coupled to the second bus, wherein the transcoder is configured to generate a transcode bit for each frame; a syndrome generator that is coupled to the second bus, wherein the syndrome generator uses a number of bits that are equal to the second width, and wherein the syndrome generator is configured to generate a set of parity bits for each frame; and a converter that is coupled to the second bus and that is coupled to the PMA sublayer logic by way of a third bus having the first width, wherein the converter is configured to generate a frame having a data payload concatenated with the set of parity bits.

In accordance with the present invention, the apparatus further comprises a plurality of hosts, wherein each host is coupled to at least one of the MAC circuits

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
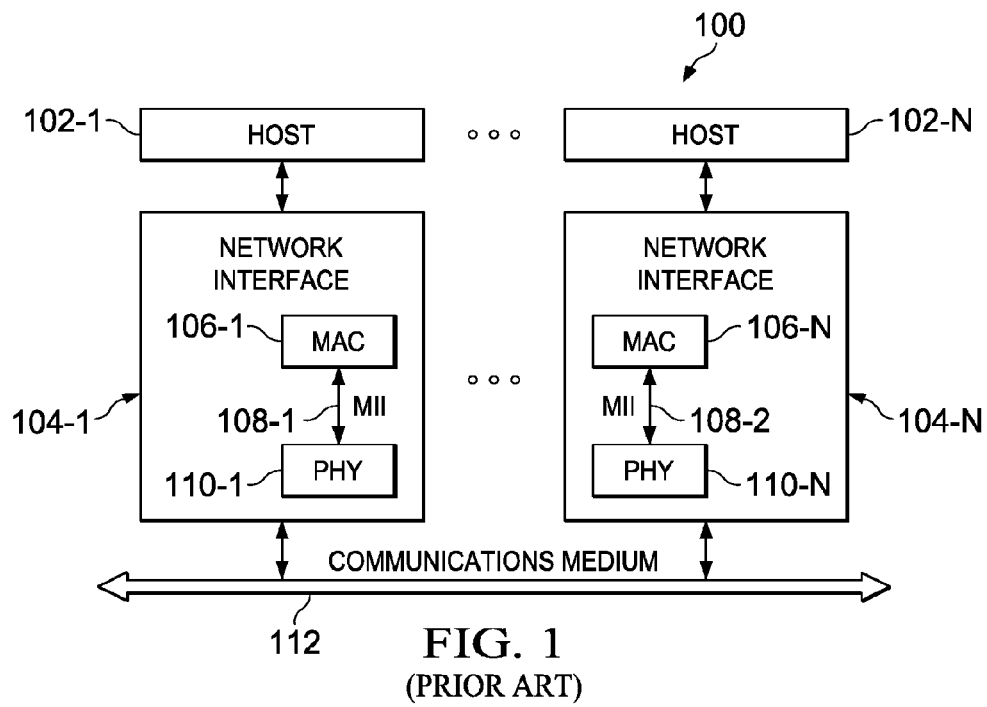
FIG. 1 is a diagram of an example of a conventional system.
Figure 2:
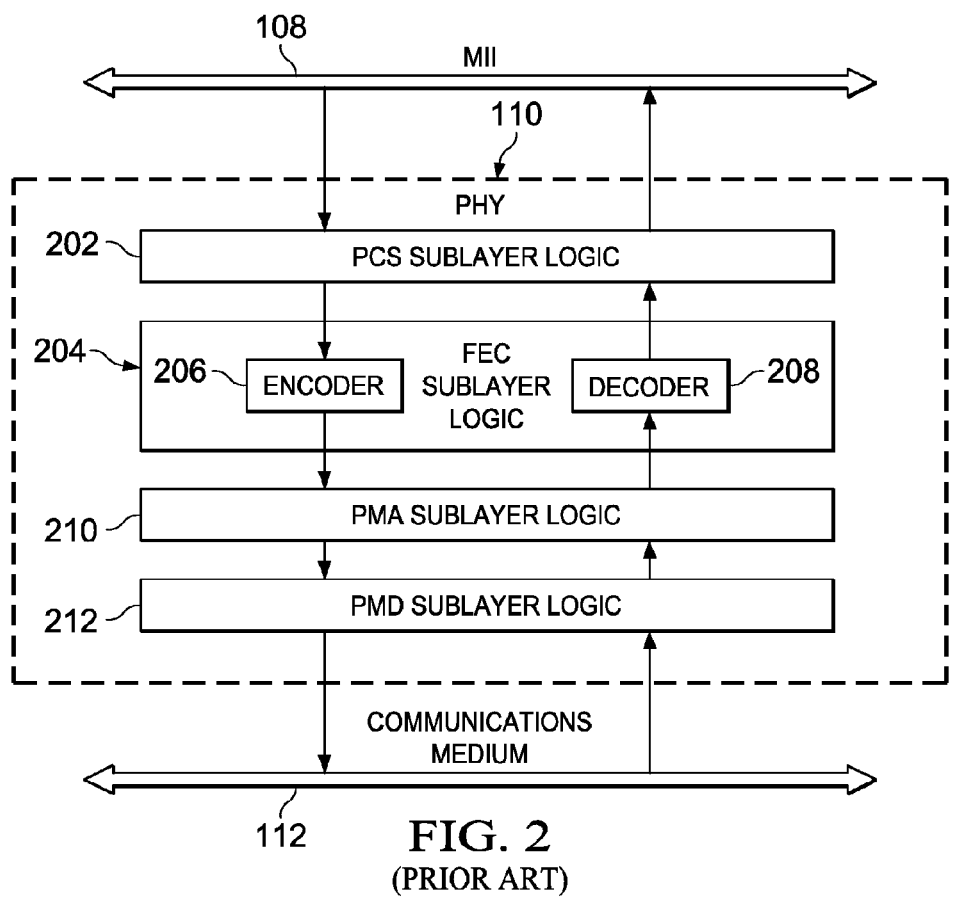
FIG. 2 is a diagram of an example of a PHY of FIG. 1.
Figure 3:
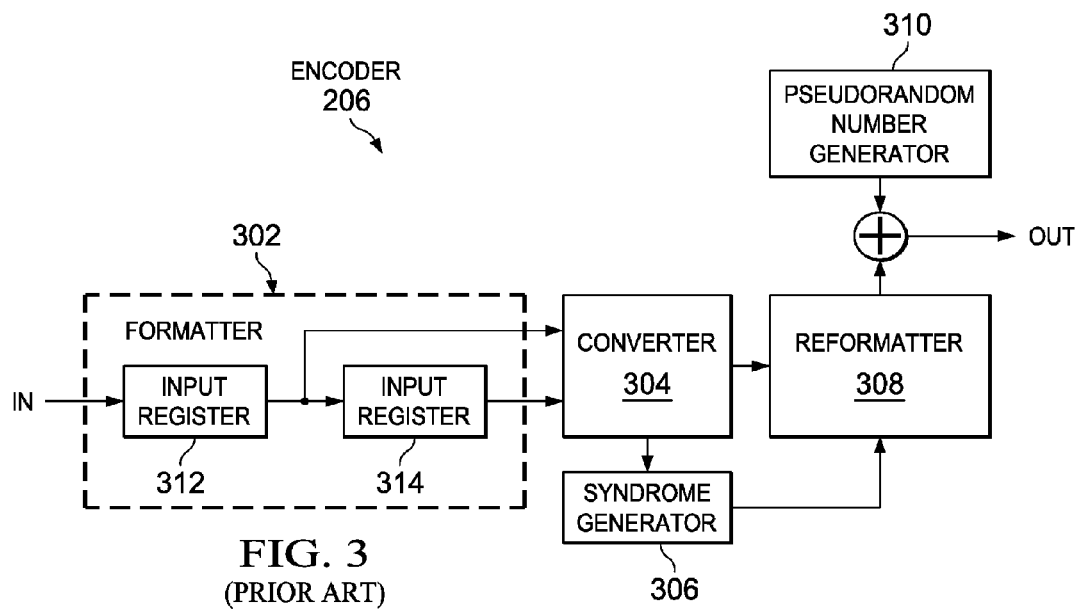
FIG. 3 is a diagram of an encoder of FIG. 2.

Refer now to the drawings wherein depicted elements are, for the sake of clarity, not necessarily shown to scale and wherein like or similar elements are designated by the same reference numeral through the several views.

Figure 4:
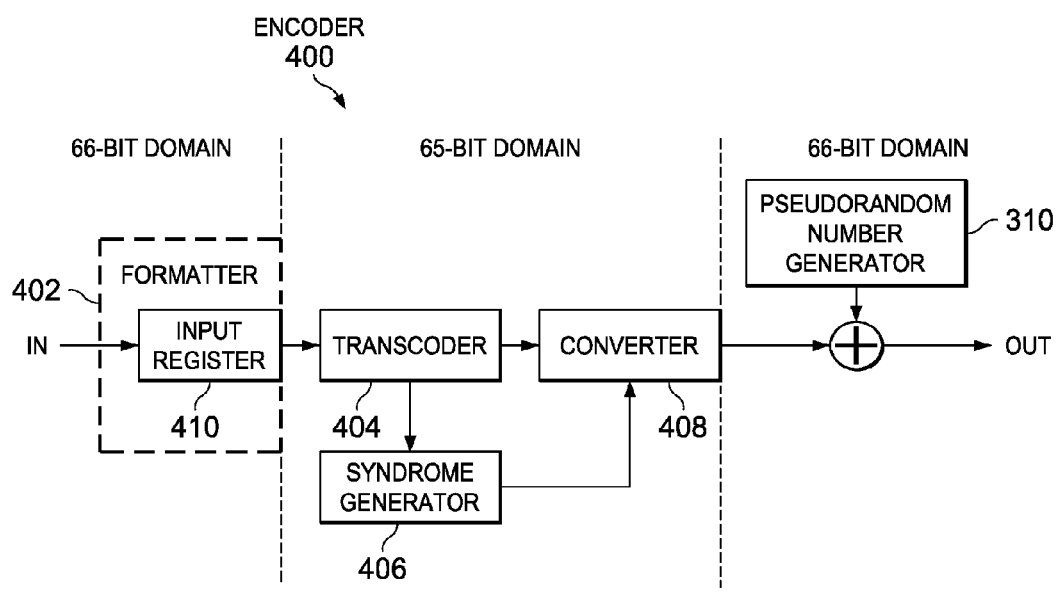
FIG. 4 is a diagram of an encoder in accordance with the present invention.

Turning to FIG. 4, an example of an encoder 400, in accordance with the present invention, is provided (which is intended to replace encoder 206). Similar to encoder 206, encoder 400 can receive data words corresponding to a frame (i.e., 32 66-bit words that each have 2 header bits and 64 data payload bits) and can output a frame (i.e., having 2112 bits) in accordance with IEEE standard 802.3-2008, clause 74. However; and for example, encoder 400 uses different domains in order to generate the frame, where each domain is associated with a bus. As shown, the formatter (which generally comprises an input register 410) is coupled to PCS sublayer logic by way of a bus having, for example, a width of 66-bits. This means that the formatter 402 operates in, for example, a 66-bit domain. The input register 410 can then interface with a bus which is internal to the encoder 400 and which can, for example, have a width of 65-bits. Specifically, and for example, the input register 410 can provide intermediate data words (which correspond to a frame) onto the bus that is internal to the encoder 400.

From these intermediate data words on this internal bus, the transcoder 404 (which is coupled to the internal bus can generate a transcoder bit for a frame as set forth in IEEE standard 802.3-2008, clause 74. Additionally, the syndrome generator 406 can generate a set of parity bits for the frame (e.g., 32 parity bits). Because of the use of the internal bus (which can, for example be 65 bits in width) in encoder 400, syndrome generator 406 can be significantly simplified over syndrome generator 306 in that syndrome generator 400 can, for example, employ a 65-bit syndrome generator instead of multiple (i.e., 34-bit and 66-bit syndrome generators) with syndrome generator 306. Converter 408 can then perform a conversion (e.g., 65-bit to 66-bit conversion) so as to be able to generate a data payload for a frame that can be output onto an output bus (which typically has the same width as the bus coupled to formatter 402) and can concatenate the set of parity bits (e.g., 32 parity bits) with the data payload. For example, the converter 408 can generate a data payload of 2080 bits. The pseudorandom number generator 310 and combiner (which can generally function as a scrambler that is coupled to a, for example, 66-bit bus) can then scramble the frame using a (for example) 2112-bit pseudonoise sequence.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   physical medium dependant (PMD) sublayer logic that is configured to communicate with a communications medium;
   PMA sublayer logic that is coupled to the PMD logic;
   PCS sublayer logic that is configured to communicate with an interface; and
   forward error correction (FEC) sublayer logic having:
      a decoder that is coupled to the PMA sublayer logic and the PCS sublayer logic; and
      an encoder having:
         a formatter that is coupled to the PCS sublayer logic by way of a first bus having a first width;
         a second bus having a second width that is coupled to the formatter;
         a transcoder that is coupled to the second bus, wherein the transcoder is configured to generate a transcode bit for each frame;
         a syndrome generator that is coupled to the second bus, wherein the syndrome generator uses a number of bits that are equal to the second width, and wherein the syndrome generator is configured to generate a set of parity bits for each data word; and
         a converter that is coupled to the second bus and that is coupled to the PMA sublayer logic by way of a third bus having the first width, wherein the converter is configured to generate a frame having a data payload concatenated with the set of parity bits,
   wherein the encoder further comprises a scrambling circuit that is coupled to the third bus,
   wherein the scrambling circuit further comprises:
      a pseudorandom number generator; and
      a combiner that is coupled to the pseudorandom number generator and the third bus,
   wherein the formatter further comprises an input register,
   wherein the first width is 66 bits, and wherein the second width is 65 bits.

2. The apparatus of claim 1, wherein the set of parity bits has 32 bits, and wherein the frame is 2112 bits.

3. The apparatus of claim 2, wherein the pseudorandom number generator is configured to generate a pseudo-noise sequence that is 2112 bits in length.

4. An apparatus comprising:
   a communications medium;
   a plurality of network interfaces, wherein each network interface includes:
      a media access control (MAC) circuit;
      a media independent interface (MII) that is coupled to the MAC circuit; and
      a physical transceiver (PHY) having:
         PMD sublayer logic that is configured to communicate with a communications medium;
         PMA sublayer logic that is coupled to the PMD logic;
         PCS sublayer logic that is coupled to the MII; and
         FEC sublayer logic having:
            a decoder that is coupled to the PMA sublayer logic and the PCS sublayer logic; and
            an encoder having:
               a formatter that is coupled to the PCS sublayer logic by way of a first bus having a first width;
               a second bus having a second width that is coupled to the formatter;
               a transcoder that is coupled to the second bus, wherein the transcoder is configured to generate a transcode bit for each data word,
               a syndrome generator that is coupled to the second bus, wherein the syndrome generator uses a number of bits that are equal to the second width, and wherein the syndrome generator is configured to generate a set of parity bits for each frame; and
               a converter that is coupled to the second bus and that is coupled to the PMA sublayer logic by way of a third bus having the first width, wherein the converter is configured to generate a frame having a data payload concatenated with the set of parity bits,
   wherein the encoder further comprises a scrambling circuit that is coupled to the third bus,
   wherein the scrambling circuit further comprises:
      a pseudorandom number generator; and
      a combiner that is coupled to the pseudorandom number generator and the third bus,
   wherein the formatter further comprises an input register,
   wherein the apparatus further comprises a plurality of hosts, wherein each host is coupled to at least one of the MAC circuits,
   wherein the first width is 66 bits, and wherein the second width is 65 bits.

5. The apparatus of claim 4, wherein the set of parity bits has 32 bits, the frame is 2112 bits, and the pseudorandom number generator is configured to generate a pseudo-noise sequence that is 2112 bits in length.

* * * * *